United States Patent [19]

Yasutake et al.

[11] Patent Number: 4,607,333

[45] Date of Patent: Aug. 19, 1986

[54] ELECTRON BEAM EXPOSURE APPARATUS

[75] Inventors: Nobuyuki Yasutake; Hiroshi Yasuda, both of Yokohama, Japan

[73] Assignee: Fujitsu Limited, Kawasaki, Japan

[21] Appl. No.: 566,322

[22] Filed: Dec. 28, 1983

[30] Foreign Application Priority Data

Dec. 29, 1982 [JP] Japan .................. 57-233763

[51] Int. Cl.$^4$ .................. G06F 15/46; H01J 37/304
[52] U.S. Cl. .................. 364/400; 250/398; 250/492.2; 364/490; 364/571
[58] Field of Search .................. 364/400, 488–491, 364/571; 250/492.1, 492.2, 492.3, 398

[56] References Cited

U.S. PATENT DOCUMENTS

| | | | |
|---|---|---|---|
| 4,362,942 | 12/1982 | Yasuda | 250/492.2 X |
| 4,363,953 | 12/1982 | Katsuta et al. | 250/492.2 X |
| 4,413,187 | 11/1983 | Akazawa et al. | 250/492.2 X |
| 4,430,571 | 2/1984 | Smith et al. | 250/492.2 |
| 4,443,703 | 4/1984 | Shimazu et al. | 250/492.2 X |
| 4,469,950 | 9/1984 | Taylor et al. | 250/492.2 |
| 4,494,004 | 1/1985 | Mauer, IV et al. | 250/492.2 |

Primary Examiner—Joseph Ruggiero
Attorney, Agent, or Firm—Staas & Halsey

[57] ABSTRACT

An electron beam exposure apparatus includes an electromagnetic-type deflector for deflecting an electron beam in accordance with an analog signal corresponding to a digital signal which specifies an exposure region of a sample and an electrostatic-type deflector for deflecting the electron beam to a desired position in the exposure region. A difference signal representing the difference between the analog signal and a reference analog signal corresponding to the digital signal is taken out for compensating the amount of deflection of the electron beam in the electrostatic-type deflector.

6 Claims, 7 Drawing Figures

ELECTRON BEAM EXPOSURE APPARATUS

BACKGROUND OF THE INVENTION

1. Field of the Invention

The present invention relates to an electron beam exposure apparatus and more particularly to a deflection control circuit of an electron beam exposure apparatus.

2. Description of the Prior Art

Conventionally, various types of electron beam exposure apparatus have been proposed, and an electron beam exposure apparatus in which a sample or workpiece can be exposed, via a rectangular aperture, by an electron beam having a rectangular section has been conventionally used.

Further, there is used a deflection system in an electron beam exposure apparatus which uses an electromagnetic-type deflector and an electrostatic-type deflector and in which the deflection range is divided so that the electron beam is deflected by a small amplitude and a large amplitude, with the result that the exposure time is shortened and a high-accuracy electron beam exposure can be carried out.

In such an apparatus, the time required for scanning the electromagnetic-type deflector is much longer than the time required for scanning the electrostatic-type deflector and the waiting time in the electromagnetic-type deflector is from 50 to 100 $\mu$s, with the result that high-speed electron beam exposure cannot be carried out.

OBJECTS AND SUMMARY OF THE INVENTION

An object of the present invention is to provide an electron beam exposure apparatus which can carry out a high-speed exposure.

Another object of the present invention is to provide an electron beam exposure apparatus in which the waiting time of the electromagnetic-type deflector is shortened.

The above-mentioned objects can be achieved by providing an electron beam exposure apparatus comprising a first deflection means which deflects an electron beam based on a signal for specifying the exposure region of the sample, a second deflection means which deflects the electron beam in a desired portion in the exposure region, and means for compensating the deflection amount of the electron beam in the second deflection means in accordance with the error component of the value of the current of the deflection signal in the first deflection means.

Further features and advantages of the present invention will be apparent from the ensuing description, with reference to the accompanying drawings, to which, however, the scope of the invention is in no way limited.

DESCRIPTION OF THE PREFERRED EMBODIMENTS

Figure 1:
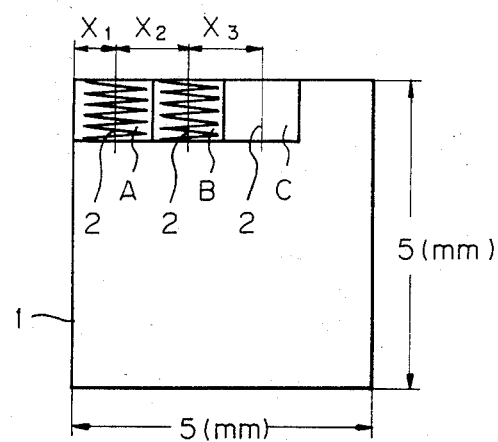
FIG. 1 is a plan view of a sample showing the method for exposing an electron beam in a conventional electron beam exposure apparatus.

In a conventional electron beam exposure apparatus, as is shown in FIG. 1, a chip 1 having dimensions of 5×5 mm (main field) is placed on and is fixed to a mount of the electron beam exposure apparatus. Next, the electron beam is deflected over small regions A, B, C, . . . having, for example, an area of 100 $\mu$m × 100 $\mu$m (so-called subfields) along the X axis direction. A computer designates the settling time as 20 $\mu$s and the intervals between the center lines 2 of the small regions as $x_1 = 50$ $\mu$m, $x_2 = x_3, \ldots 100$ $\mu$m. In the above-mentioned condition, if the amplifier of the electrostatic-type deflector designates the settling time to be 100 ns at an interval of 0.05 $\mu$m, exposure of the sample can be carried out at a high speed and a high accuracy. Such electron beam exposure apparatus and the construction of its deflection control apparatus will be explained next.

Figure 2:
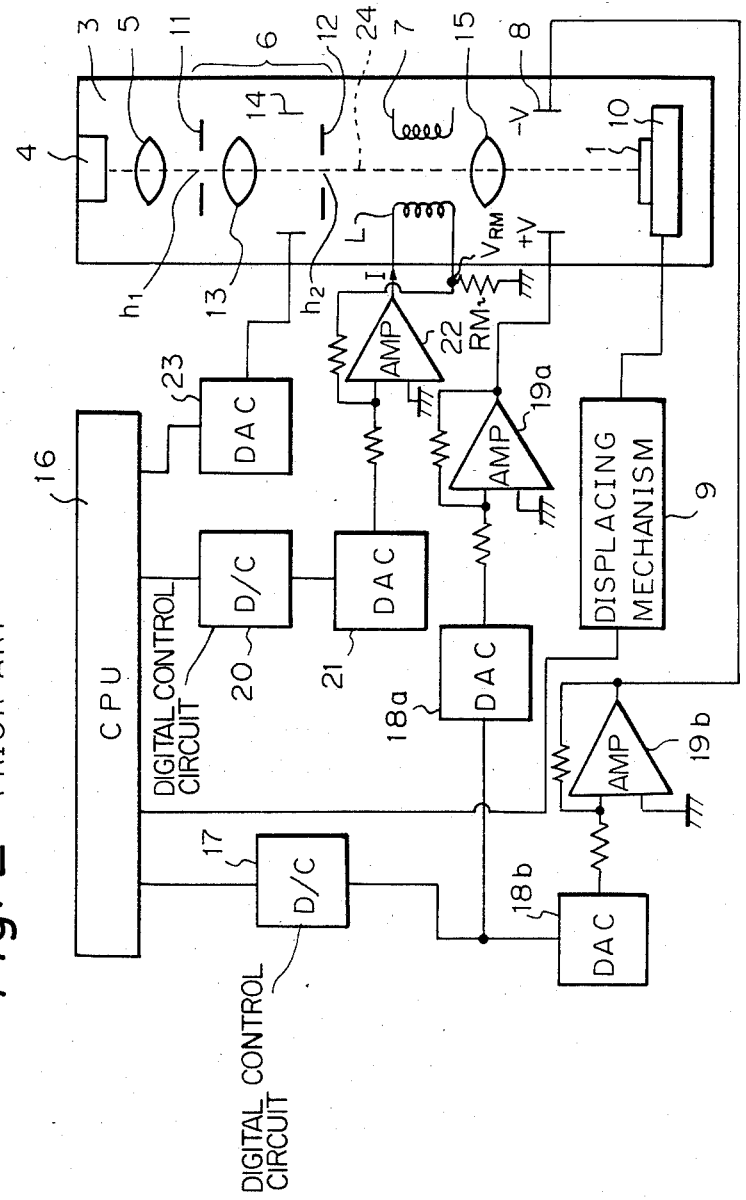
FIG. 2 is a system diagram of the deflection control device in the conventional electron beam exposure apparatus of FIG. 1.

FIG. 2 shows an electron beam exposure apparatus and a deflection control apparatus. The electron beam exposure apparatus 3 is composed of an electron gun 4, a focussing lens 5 for focussing the electrons generated from the electron gun 4, a changing means 6 for changing the rectangular form of the electron beam, an electromagnetic-type deflector 7 for selecting the center position of the subfields A, B, C, . . . , an electrostatic-type deflector 8 for scanning the subfields, a displacing mechanism 9, and a mount 10 on which the sample 1, which is displaced in the X Y axis direction by the displacing mechanism 9, is mounted.

The changing means 6 for changing the rectangular form of the electron beam is formed, for example, from an electron lens 13 and a deflector 14 for forming an electron beam, the elements 13 and 14 being arranged between slits 11 and 12 in which rectangular apertures $h_1$ and $h_2$ are provided. Reference numeral 15 is a lens for projecting an electron beam 24 having a rectangular section which is obtained from the changing means 6 for changing the rectangular form of the electron beam on the sample 1.

Reference numeral 16 designates a computer. The electron beam exposure apparatus 3 is controlled by a program which stores the desired circuit pattern, and the data of the computer 16 is supplied to the electrostatic-type deflector 8 via a digital control circuit 17, digital to analog converters 18a, 18b (hereinafter referred to as DAC), and amplifiers 19a, 19b as a voltage which is proportional to the amount of deflection.

The data of the computer 16 is also supplied to the electromagnetic deflector 7 via a digital control circuit 20, a DAC 21, and an amplifier 22 In the drawing, only one, for example, the X axis direction, circuit arrangement is shown. However, it should be understood that the same control circuit is provided for the electromagnetic-type deflector and the electrostatic-type deflector in the Y axis direction. Further, the displacing mechanism 9, the electron beam-forming deflector 14, etc., are controlled by the data of the computer 16. Also, only the DAC 23 is shown in the circuit for supplying data from the computer 16 to the electron beam-forming deflector 14. However, it should be understood that another digital control circuit, another amplifier, etc. are also necessary. These elements are omitted in the drawing because they are well known to a person skilled in the art.

A monitor resistor RM is connected between the coil L of the electromagnetic-type deflector and the ground.

When a current I flows in a coil L of the electromagnetic-type deflector 7, the electron beam 24 is deflected by a force which is proportional to the flux generated by the current I. As an output voltage $V_{RM}$ of the monitor resistor RM corresponds to the current I, it can be said that the position of the electron beam 24 corresponds to the output level of the monitor resistor R.

The electron beam 24, which passes through the electromagnetic-type deflector, receives a power which is proportional to a voltage $\pm V$ applied to the deflection plates of the electrostatic-type deflector 8 so that the electron beam is positioned.

Figure 3:
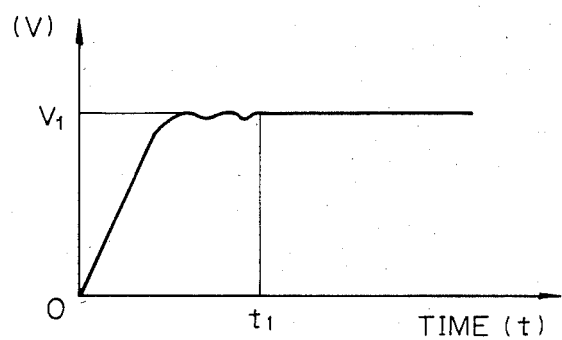
FIG. 3 is a diagram showing the rise time in the output amplifier in the deflection system of FIG. 2.

As was mentioned above, the deflections $X_1$, $X_2$, $X_3$, ... to the center of the subfields A, B, C, ... are effected by the electromagnetic-type deflector 7, and the subfields are scanned by the electrostatic-type deflector 8 so that a pattern is formed on the sample. Therefore, when we assume that the electron beam is largely deflected, for example, from a center line 2 ($X_1$) of the subfield A to a center line 2 ($X_2$) of the subfield B, the relationship between the output voltage of the amplifier 22 which is proportional to the amount of deflection of the electron beam in the X or Y axis direction, and time is as is shown in FIG. 3. That is, the time $t_1$ is required so as to attain the predetermined output $V_1$. Deflection of the electrostatic-type deflector 8 cannot be carried out until the output of the amplifier 22 reaches a predetermined voltage value $V_1$, that is, the waiting time for obtaining the predetermined voltage $V_1$ is long, and therefore, a high speed exposure can not be carried out.

Next, one embodiment of the present invention is explained in detail with reference to FIGS. 4 and 5A to 5C.

Figure 4:
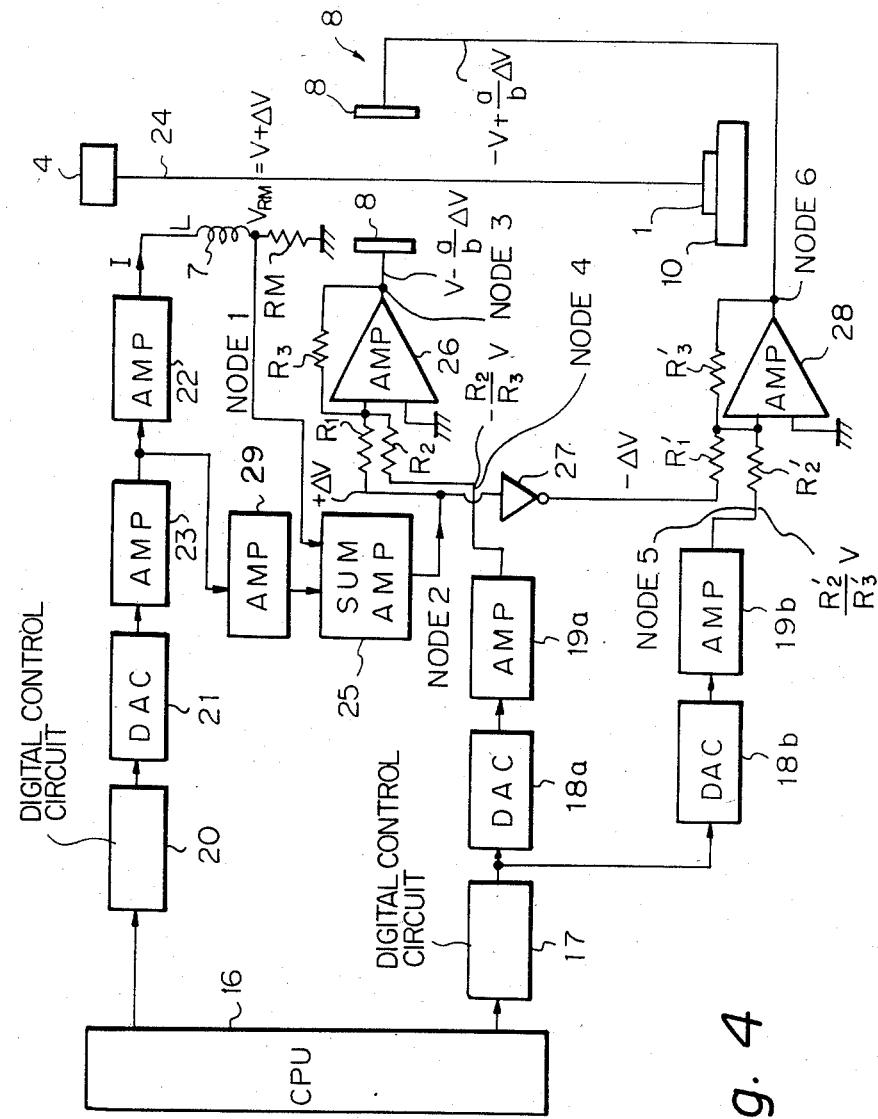
FIG. 4 is a system diagram of the deflection control system in the electron beam exposure apparatus according to the present invention.
Figure 5A:
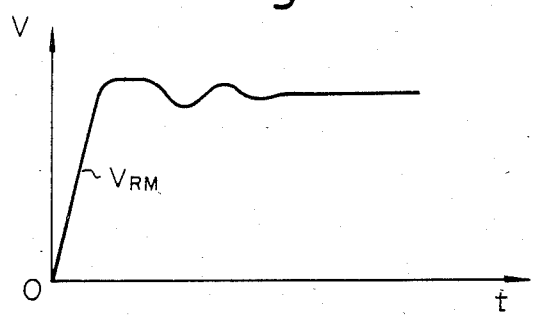
FIGS. 5A, 5B, and 5C are waveforms in the essential portion of the deflection control system shown in FIG. 4.
Figure 5B:
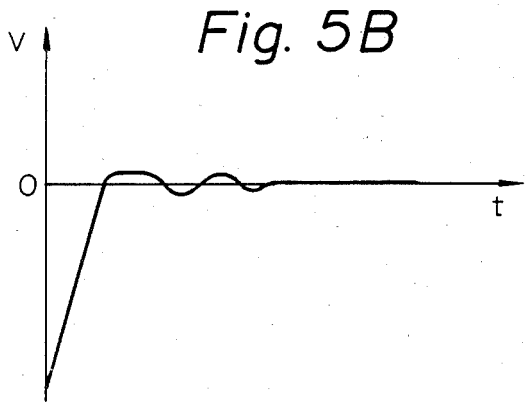
Figure 5C:
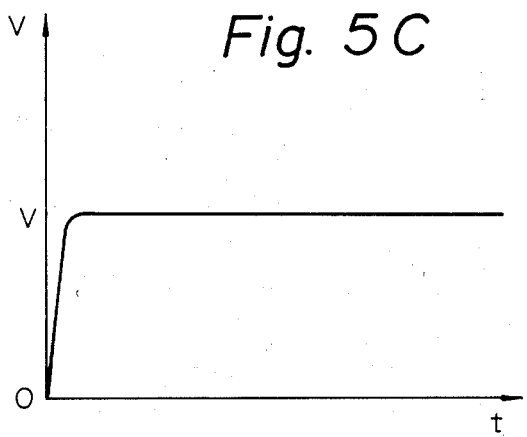

FIG. 4 shows the system of the essential portion of the deflection control apparatus of the electron beam exposure apparatus according to the present invention, and FIGS. 5A through 5C show the waveforms in each portion of FIG. 4. Further, in FIG. 4, the portions which are the same as those in FIG. 2 are indicated by the same symbols as in FIG. 2.

An electromagnetic-type deflector 7, that is, a first deflection system, receives data from a computer 16 via a digital control circuit 20, a DAC 21, an amplifier 23, an output amplifier 22, a coil L of the deflector 7, a monitor resistor RM, the ground, and the computer 16. For example, when a value of V volts is specified to the electromagnetic deflection coil L, the beam is deflected by a force corresponding to V volts.

On the other hand, the output of the amplifier 23 is supplied to an amplifier 29, and the output of the amplifier 29 supplies a voltage $(-V)$ which is the inverted output voltage V given by the computer. Actually, if the value of the monitored output voltage in the monitor resistor RM connected to one terminal of the electromagnetic deflection coil L is $V + \Delta V$ volt, it should be understood that an error $\Delta V$ will occur in this system.

The voltage $V_{RM}$ shown as NODE 1 in the monitor resistor RM is $V_{RM} = V + \Delta V$ and has a rising waveform as is shown in FIG. 5A, and the detected voltage $V + \Delta V$ is supplied to the summing amplifier 25.

On the other hand, the output voltage $(-V)$ which is obtained by inverting the setting value V from the amplifier 29 is also supplied to the summing amplifier 25 and the error voltage $+\Delta V$ is obtained as the output of the summing amplifier 25.

This error voltage $+\Delta V$ in NODE 2 is shown in FIG. 5B.

The output of the summing amplifier 25 is supplied to a first input of the output amplifier 26 via a resistor $R_1$. A resistor $R_3$ is connected between the first input terminal and the output terminal of the output amplifier 26, a second input terminal of the output amplifier 26 is connected to the ground, and the output terminal of the output amplifier 26 is connected to one deflection plate 8' of an electrostatic-type deflector 8 comprising plates 8' and 8''. The first input also receives a setting voltage V from the computer via the digital control circuit 17, the DAC 18a, the amplifier 19a, the resistor $R_2$, and the output amplifier 26.

Further, the output of the output amplifier 28 is supplied to the other deflection plate 8'' of the electrostatic-type deflector 8. The output amplifier 28 is provided with a feedback resistor $R'_3$ which is connected from the output terminal to the first input terminal, and the error voltage $+\Delta V$ from the summing amplifier 25 is inverted to $-\Delta V$, the inverted voltage $-\Delta V$ being applied to the first input of the output amplifier 28. The first input terminal also receives the setting voltage V from the computer 16 via the digital control circuit 17, the DAC 18b, the amplifier 19b, and the resistor $R'_2$. The second input terminal of the output amplifier 28 is grounded.

In the above-mentioned construction, we assume that when the monitor output voltage is $\pm V$ volts, the amount of deflection (deviation) of the electron beam 24 is $\pm a$ V $\mu$m.

Further, we assume that when the voltage of the electrostatic-type deflector 8 is $\pm V$ volts, the amount of deflection (deviation) of the electron beam 24 is $\pm b$ V $\mu$m and deflection of the electron beam 24 is a $\Delta V$ $\mu$m at the error voltage of $\Delta V$.

To cancel this error voltage, it is sufficient if the voltage $(-a/b) \Delta V$ is supplied to the electrostatic-type deflector 8 in the second deflection system. That is, $$a\Delta V + bx(-a/b)\Delta V = 0$$

This cancellation can be effected by adjusting the conversion factor in the system from the monitor resistor RM connected to the deflection coil L of the electromagnetic-type deflector 7 in the first deflection system to the electrostatic-type deflector 8 in the second deflection system.

For example, when this cancellation is carried out by the output amplifier 26 in the electrostatic-type deflector 8, the voltage in NODE 4 (the output of the amplifier 19a) is placed to $-(R_2/R_3)V$ for the purpose of obtaining the output $V - a/b\Delta V$ in NODE 3. If the relation $$R_3/R_1 = a/b$$

is set, the relation $$-\Delta V \times R_3/R_1 = -a/b\Delta V$$

is established, and the error component $\Delta V$ appearing in the electromagnetic-type deflector 7 can be compensated by $(-a/b)\Delta V$ in the electrostatic-type deflector 8. With respect to the output amplifier 28 in the electrostatic-type deflector 8, when the output value in NODE 5 is set to the value $R'_2/R'_3$, the output value $-V+(a/b)\Delta V$ can be obtained in NODE 6.

Thus, as is shown by the waveform in FIG. 5C, the error component $\Delta V$ in the electromagnetic-type deflector 7 can be compensated by the output amplifier of the electrostatic-type deflector 8. That is, in the present invention, the operating speed of the electromagnetic-type deflector 7 in the first deflection system is slow so that the operating speed of the output amplifier 22 is on the order of from several micro seconds to several tens of micro seconds while the operating speed of the electrostatic-type deflector 8 in the second deflector system is rapid, that is, on the order of hundreds of times the operating speed of the electromagnetic-type deflector 7. Therefore, when the operating speed of the amplifiers 25, 26, 19a, 19b, 28, 29 etc. is set to be the same as that of the electrostatic-type deflector 8, the error of the electromagnetic-type deflector can be sufficiently compensated.

Further, considering the monitor resistor RM, the input impedance of the summing amplifier 25 must be sufficiently high.

In the above explanation, the electromagnetic-type deflector and the electrostatic-type deflector are used as the first deflection system and the second deflection system, respectively. However, both the first deflection system and the second deflection system may be an electromagnetic-type deflector or an electrostatic-type deflector. For example, the error component can be compensated by supplying the error output to the deflection coil used in a scanning electron microscope attached to the electron beam exposure apparatus.

In the above-mentioned explanation, only the deflection system in the direction of the X axis is explained. The axis directions of the electromagnetic-type deflector and the electrostatic-type deflector are, however, not completely coincident. Therefore, it should be understood that the error component of the first deflection system must be allotted to the X axis and Y axis of the second deflection system.

As was mentioned in detail above, according to the present invention, the difference between the actual output of the first deflection system and the command value of the computer is detected in the summing amplifier and is supplied to the second deflection system so as to cancel the error component. Therefore, the waiting time for scanning or the waiting time in the second deflection system which conventionally requires from 50 to 100 s, can be shortened to several hundred nanoseconds.

We claim:

1. An electron beam exposure apparatus for exposing a workpiece with an electron beam, comprising:
    a first deflection means for deflecting the electron beam in response to a deflection signal, said deflection signal corresponding to an exposure region of the workpiece;
    a second deflection means for deflecting the electron beam by a desired reflection amount in said exposure region of the workpiece; and
    compensating means for obtaining an error signal corresponding to an error component of the value of the voltage of the deflection signal in said first deflection means, and for compensating the deflection amount of the electron beam in said second deflection means in accordance with the error signal.

2. An electron beam exposure apparatus according to claim 1, wherein said first deflection means is an electromagnetic-type deflection means and said second deflection means is an electrostatic-type deflection means.

3. An electron beam exposure apparatus according to claim 2, wherein:
    said electromagnetic-type deflection means comprises a first digital control circuit for receiving a digital signal from a computer, a first digital analog converter connected to said first digital control circuit, a first amplifier connected to said first digital analog converter, a second amplifier connected to said first amplifier, a deflection coil connected to an output of said second amplifier, and a monitor resistor connected to said deflection coil;
    said electrostatic-type deflection means comprises first and second deflection plates, a second digital control circuit for receiving a digital signal from said computer, a second digital analog converter connected to said second digital control circuit, a third amplifier connected to said second digital analog converter, a fourth amplifier connected between an output of said third amplifier and the first deflection plate, a third digital analog converter connected to said second digital control circuit, a fifth amplifier connected to said third digital analog converter, and a sixth amplifier connected between an output of said fifth amplifier and the second deflection plate; and
    said compensating means comprises a seventh amplifier connected to an output of said first amplifier so as to invert the output of said first amplifier, a summing amplifier having input terminals connected to an output of said seventh amplifier and said monitor resistor and an output terminal connected to said fourth amplifier together with an output of said third amplifier, and an inverter having an input terminal connected to an output of said summing amplifier and an output terminal connected to said sixth amplifier together with an output of said fifth amplifier.

4. An electron beam exposure apparatus according to claim 3 wherein said compensating means further comprises:
    a first resistor, having a resistance $R_1$, connected to an output of said summing amplifier and an input of said fourth amplifier;
    a second resistor, having a resistance $R_2$, connected to an output of said third amplifier and an input of said fourth amplifier;
    a third resistor, having a resistance $R_3$, connected to an input of said fourth amplifier and an output of said fourth amplifier;
    a fourth resistor, having a resistance $R_1'$, connected to said inverter and an input of said sixth amplifier;
    a fifth resistor; having a resistance $R_2'$, connected to an output of said fifth amplifier and the input of said sixth amplifier; and
    a sixth resistor, having a resistance $R_3'$, connected to the input of said sixth amplifier and an output of said sixth amplifier, said output of said third amplifier having a value equal to a ratio of said resistance $R_2$ to said resistance $R_3$, said output of said fifth amplifier having a value equal to a ratio of said resistance $R_2'$ to said resistance $R_3'$ and said output of said fourth amplifier and said output of said sixth amplifier having values in accordance with a ratio of said resistance $R_3$ to said resistance $R_1$.

5. An electron beam exposure apparatus according to claim 3 wherein said second amplifier has an analog output signal, said compensating means has an output determined in accordance with a difference between said analog output signal of said second amplifier and said digital signal output by said computer, and said electromagnetic-type deflector deflects the electron beam in accordance with said analog output signal of said second amplifier and said output of said compensating means.

6. An electron beam exposure apparatus for exposing a workpiece with an electron beam, comprising:

means for generating a deflection signal corresponding to a first deflection amount, the first deflection amount specifying an exposure region of the workpiece;

first deflection means, responsive to the deflection signal, for deflecting the electron beam;

second deflection means for deflecting the electron beam by a second deflection amount in the exposure region; and compensating means for generating an error signal corresponding to the difference between the first deflection amount and the deflection produced by said first deflection means and for compensating the second deflection amount of the electron beam in accordance with the error signal.

* * * * *

UNITED STATES PATENT AND TRADEMARK OFFICE
CERTIFICATE OF CORRECTION

PATENT NO. : 4,607,333
DATED : August 19, 1986
INVENTOR(S) : Yasutake et al.

It is certified that error appears in the above-identified patent and that said Letters Patent is hereby corrected as shown below:

Col. 2, line 59, after "22" insert --.--.

Col. 3, line 14, "R" should be --RM--;
line 29, after "22" insert --,--;
line 31, delete "the".

Col. 4, line 15, "8" (first occurrence) should be --8'--.

Col. 5, line 51, after "system" insert --,--;
line 52, "100s" should be --100 µs--.

Col. 6, line 58, ";" should be --,--.

Signed and Sealed this

Twentieth Day of January, 1987

Attest:

DONALD J. QUIGG

*Attesting Officer*     *Commissioner of Patents and Trademarks*